United States Patent
Kim et al.

(10) Patent No.: US 10,304,788 B1
(45) Date of Patent: May 28, 2019

(54) SEMICONDUCTOR POWER MODULE TO PROTECT AGAINST SHORT CIRCUIT EVENT

(71) Applicant: SEMICONDUCTOR COMPONENTS INDUSTRIES, LLC, Phoenix, AZ (US)

(72) Inventors: Jihwan Kim, Seoul (KR); Heeyoung Song, Bucheon (KR); Gwigyeon Yang, Incheon (KR); Olaf Zschieschang, Vaterstetten (DE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/950,749

(22) Filed: Apr. 11, 2018

(51) Int. Cl.
| | |
|---|---|
| *H01L 23/48* | (2006.01) |
| *H01L 23/52* | (2006.01) |
| *H01L 29/40* | (2006.01) |
| *H01L 23/62* | (2006.01) |
| *H01L 23/29* | (2006.01) |
| *H01L 23/24* | (2006.01) |
| *H01L 23/00* | (2006.01) |
| *H01L 23/31* | (2006.01) |

(52) U.S. Cl.
CPC .............. *H01L 23/62* (2013.01); *H01L 23/24* (2013.01); *H01L 23/29* (2013.01); *H01L 23/3157* (2013.01); *H01L 24/45* (2013.01); *H01L 24/48* (2013.01)

(58) Field of Classification Search
CPC .............. H01L 33/52; H01L 2924/181; H01L 2224/85; H01L 2223/6611
USPC .................................. 257/787, 790; 438/127
See application file for complete search history.

(56) References Cited

U.S. PATENT DOCUMENTS

| | | | | |
|---|---|---|---|---|
| 8,530,282 B2* | 9/2013 | Taya | ........................ | B29C 45/02 257/685 |
| 8,772,953 B2* | 7/2014 | Taya | ........................ | H01L 21/56 257/790 |
| 2004/0061243 A1* | 4/2004 | Bai | .......................... | H01L 23/13 257/787 |
| 2004/0084784 A1* | 5/2004 | Mueller | ................ | H01L 23/296 257/788 |
| 2008/0258316 A1 | 10/2008 | Tamba et al. | | |
| 2011/0115068 A1 | 5/2011 | Hartung et al. | | |

(Continued)

OTHER PUBLICATIONS

Thomas Radke et al., Mitsubishi Electric Corp., "More Power and Higher Reliability by 7th Gen. IGBT Module with New SLC-Technology", EE Power LLC, Technical Article, Aug. 1, 2015.

*Primary Examiner* — S. V. Clark
(74) *Attorney, Agent, or Firm* — Brake Hughes Bellermann LLP

(57) ABSTRACT

According to an aspect, a semiconductor power module includes a substrate, a semiconductor device coupled to the substrate, a bond wire coupled to the semiconductor device, and a first molding material layer disposed on the substrate. The first molding material layer encapsulates a first portion of the bond wire. The bond wire has a second portion disposed outside of the first molding material layer. The semiconductor power module includes a second molding material layer disposed on the first molding material layer. The second molding material layer encapsulates the second portion of the bond wire. The second molding material layer has a hardness less than a hardness of the second molding material layer.

20 Claims, 4 Drawing Sheets

(56) References Cited

U.S. PATENT DOCUMENTS

2012/0199991 A1\* 8/2012 Okamoto ............ H01L 23/3142
257/790

\* cited by examiner

SEMICONDUCTOR POWER MODULE TO PROTECT AGAINST SHORT CIRCUIT EVENT

TECHNICAL FIELD

This description relates to improving the protection of a power semiconductor module in the event of overcurrent or short circuit event.

BACKGROUND

A transfer molded module is a power module package in which an epoxy material forms the package around the power circuit in a molding process. Another type of package is a case module, which uses a frame potted with a potting material to protect the semiconductor device. However, under some conditions, packages that use a hard potting material (in either a transfer molded module or a case module) as a protection layer may break in a short circuit event of the power semiconductor devices. For example, a short circuit event may cause a flow of high current within a short time resulting in overheating of the semiconductor device and adjoining assembly materials, and potentially the cracking of the substrate.

SUMMARY

According to an aspect, a semiconductor power module includes a substrate, a semiconductor device coupled to the substrate, a bond wire coupled to the semiconductor device, and a first molding material layer disposed on the substrate. The first molding material layer encapsulates a first portion of the bond wire. The bond wire has a second portion disposed outside of the first molding material layer. The semiconductor power module includes a second molding material layer disposed on the first molding material layer. The second molding material layer encapsulates the second portion of the bond wire. The second molding material layer has a hardness less than a hardness of the second molding material layer.

According to various aspects, the semiconductor power module may include one or more of the following features (or any combination thereof). The second portion of the bond wire may be configured to fuse in response to a short circuit condition. The substrate may include a ceramic substrate with a conductive portion coupled to a surface of the ceramic substrate. The first molding material layer may be a layer of epoxy. The first portion of the bond wire may be an end of the bond wire, and the end of the bond wire may be coupled to the semiconductor device at a connection location. The first molding material layer may encapsulate the connection location. The first portion of the bond wire may be a first end of the bond wire, and the first end may be coupled to the semiconductor device at a first connection location. A second end of the bond wire may be coupled to the substrate at a second connection location. The first molding material layer may encapsulate the first connection location and the second connection location. The semiconductor device may be a first semiconductor device, where the semiconductor power module further includes a second semiconductor device coupled to the substrate. The first portion of the bond wire may be a first end of the bond wire, where the first end is coupled to the first semiconductor device at a first connection location. The bond wire has a second end coupled to the second semiconductor device at a second connection location. The first molding material layer may encapsulate the first connection location and the second connection location. The second portion of the bond wire may be a portion disposed between a first end of the bond wire and a second end of the bond wire. The semiconductor power module may include a connector coupled to the substrate. The connector has a first portion encapsulated in the first molding material layer, and a second portion encapsulated in the second molding material layer. The second molding material layer may be a layer of silicone gel. The first molding material layer may have a vertical thickness greater than a vertical thickness of the second molding material layer.

According to an aspect, a semiconductor power module includes a substrate, a semiconductor device coupled to the substrate using a solder material, and a bond wire having a first end and a second end. The first end is connected to the semiconductor device at a first connection location, and the second end is connected to a portion of the substrate at second connection location. The semiconductor power module includes a housing frame coupled to the substrate, and a first molding material layer disposed on the substrate within the housing frame. The first molding material layer may have a thickness such that the first molding material layer encapsulates the semiconductor device, the solder material, the first connection location, and the second connection location. The first molding material layer does not encapsulate a portion of the bond wire between the first end and the second end. The semiconductor power module includes a second molding material layer disposed on the first molding material layer within the housing frame. The second molding material layer encapsulates the portion of the bond wire between the first end and the second end. The second molding material layer has a hardness less than a hardness of the first molding material layer.

According to various aspects, the semiconductor power module may include one or more of the above or below features (or any combination thereof). The substrate may include a direct bonded copper (DBC) substrate. The semiconductor power module may include a first terminal holder coupled to the substrate, where the first terminal holder has a first portion encapsulated in the first molding material layer and a second portion encapsulated in the second molding material layer. The semiconductor power module may include a first connector pin coupled to the first terminal holder, and a second terminal holder coupled to the substrate. The second terminal holder has a first portion encapsulated in the first molding material layer and a second portion encapsulated in the second molding material layer. The semiconductor power module may include a second connector pin coupled to the second terminal holder. A portion of the first connector pin may be encapsulated in the second molding material layer, and no portion of the first connector pin may be encapsulated in the first molding material layer. The first molding material layer may be a layer of epoxy, and the second molding material layer may be a layer of silicone gel. The housing frame may be a plastic frame. The substrate may include a ceramic substrate with a first conductive portion coupled to a first surface of the ceramic substrate. The semiconductor device may be coupled to the first conductive portion. The substrate may include a second conductive portion coupled to a second surface of the ceramic substrate. The second surface may be opposite to the first surface. In response to electrical current flowing through the bond wire exceeding a threshold amount, the bond wire may be configured to fuse at the portion of the bond wire encapsulated in the second bonding material layer causing an interruption in the connection of the semiconductor device to the substrate.

According to an aspect, a method of manufacturing a semiconductor power module includes disposing epoxy in a housing frame of a semiconductor power module having a substrate, a semiconductor device coupled to the substrate, and a bond wire coupled to the semiconductor device, curing the epoxy, where the epoxy forms a layer having a thickness such that the layer of epoxy encapsulates the semiconductor device and a first portion of the bond wire. The bond wire has a second portion that is exposed above the layer of epoxy. The method includes disposing silicone gel on top of the layer of epoxy, and curing the silicone gel, where the second portion of the bond wire is encapsulated by the silicone gel.

DETAILED DESCRIPTION

The present disclosure relates to a semiconductor power module that includes a two-layer molding (e.g., potting) configuration that can reduce (or eliminate) the damage caused by a short circuit event. The semiconductor power module may include a substrate, a semiconductor device coupled to the substrate, and a bond wire coupled to the semiconductor device. The semiconductor power module includes a first molding material layer disposed on the substrate within a housing frame. In some examples, the first molding material layer may encapsulate and protect the semiconductor device and the bond wire connections. The first molding material layer has a thickness (e.g., a vertical thickness) such that at least a portion of the bond wire is not encapsulated by the first molding material layer. In some examples, the first molding material layer includes a relatively hard molding material. In some examples, the first molding material layer is a layer of epoxy.

The semiconductor power module includes a second molding material layer disposed on the first molding material layer within the housing frame. The second molding material layer encapsulates the portion of the bond wire. The second molding material layer has a hardness less than a hardness of the first molding material layer. In some examples, the second molding material layer is a layer of silicone gel. In response to a short circuit event, the portion of the bond wire (encapsulated in the second molding material layer) fuses (e.g., disconnects, breaks part, melts), which causes the circuit to interrupt and prevents further damage to the substrate and semiconductor components.

The two-layer molding configuration may improve the reliability and lifetime of such power modules while maintaining the endurance of the substrate under a short circuit condition. For example, the two-layer molding configuration combines a relatively hard encapsulation material (e.g., the first molding material layer) that has a high reliability within a module with a relatively soft encapsulation material (e.g., the second molding material layer) that provides for safety features within the module under short circuit conditions. When the current through the bond wire exceeds a threshold level, the portion of the bond wire that is encapsulated in the second molding material layer fuses, thereby reducing (e.g., minimizing) the risk of an isolation failure caused by the substrate becoming cracked.

Figure 1:
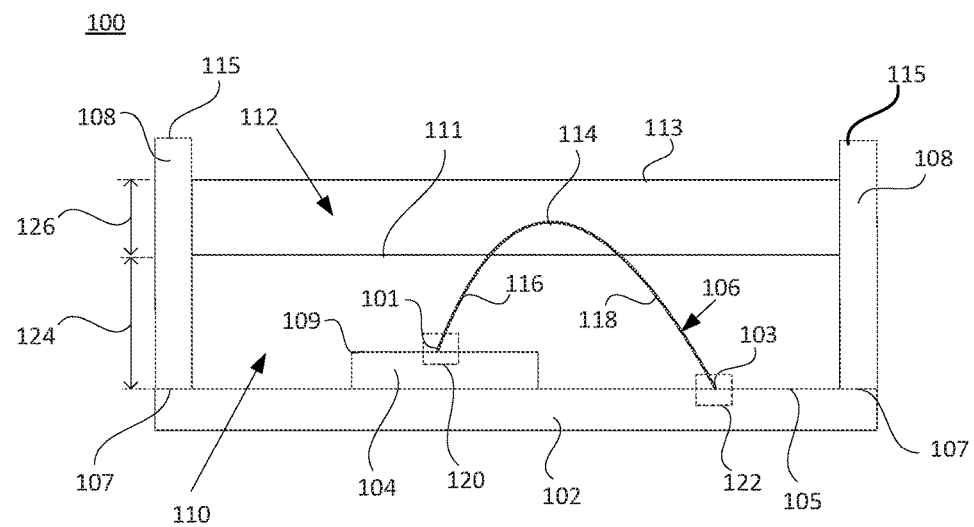
FIG. 1 illustrates a cross-sectional view of a semiconductor power module having a two-layer molding configuration according to an aspect.

FIG. 1 illustrates a cross-sectional view of a semiconductor power module 100 having a two-layer molding configuration according to an aspect. The semiconductor power module 100 includes a substrate 102, a semiconductor device 104 coupled to the substrate 102, and a bond wire 106 coupled to the semiconductor device 104.

The semiconductor power module 100 includes a two-layer molding configuration that can reduce (or eliminate) the damage caused by a short circuit condition. The two-layer molding configuration includes a first molding material layer 110 and a second molding material layer 112.

The substrate 102 is one or more layers of material on which one or more electrical devices are mounted. In some examples, the substrate 102 is an isolation substrate. In some examples, the substrate 102 includes a ceramic isolation substrate. In some examples, the substrate 102 includes an isolation substrate and a conductive portion coupled to a first surface of the isolation substrate. In some examples, the substrate 102 includes a first conductive portion coupled to the first surface of the isolation substrate, and a second conductive portion coupled to the first surface of the isolation substrate. In some examples, the substrate 102 includes one or more conductive portions coupled to the first surface of the isolation substrate and one or more conductive portions coupled to a second surface of the isolation substrate. In some examples, the substrate 102 includes a direct bonded copper (DBC) substrate having one or more copper foil portions on one or both surfaces of a ceramic isolation substrate.

The semiconductor device 104 may include one or more electrical components that use one or more semiconductor materials. In some examples, the semiconductor device 104 is a semiconductor die. In some examples, the semiconductor device 104 includes one or more integrated circuits (ICs). In some examples, the semiconductor device 104 includes a diode. In some examples, the semiconductor device 104 includes a transistor (e.g., bipolar junction transistor, field-effect transistor, a metal-oxide-semiconductor field-effect transistor (MOSFET)). The semiconductor device 104 is coupled to a top surface 105 of the substrate 102. In some examples, the semiconductor device 104 is coupled to a conductive portion (e.g., copper) that is coupled to an isolation substrate (e.g., ceramic substrate). In some examples, the semiconductor device 104 is coupled to the substrate 102 using an attachment material. In some examples, the attachment material includes a solder material. In some examples, the attachment material includes sliver sintering. In some examples, the attachment material includes an adhesive (e.g., glue).

The bond wire 106 includes a first end 101 that is coupled to the semiconductor device 104 at a first connection location 120, and a second end 103 that is coupled to a portion of the substrate 102 at a second connection location 122. In some examples, the first end 101 is bonded (e.g., using an ultrasonic bonding process) to the semiconductor device 104 at the first connection location 120, and the second end 103 is bonded to the substrate 102 at the second connection location 122. In some examples, the second end 103 is coupled to a conductive portion that is coupled to an isolation substrate (e.g., ceramic substrate). The bond wire 106 may include a metal wire (e.g., aluminum, copper, silver, gold).

The semiconductor power module 100 includes a housing frame 108 that is coupled to the substrate 102. The housing frame 108 is a casing that protects the semiconductor device 104 and other components of the semiconductor power module 100. In some examples, the housing frame 108 is coupled to an outer perimeter area 107 of the substrate 102. In some examples, the housing frame 108 includes a plastic frame.

The first molding material layer 110 is disposed on the substrate 102 within the housing frame 108. In some examples, the first molding material layer 110 encapsulates the semiconductor device 104 and the bond wire connections at the first connection location 120 and the second connection location 122. For example, the first molding material layer 110 may encapsulate a top surface 109 of the semiconductor device 104, the first end 101 of the bond wire 106, and the second end 103 of the bond wire 106. The top surface 109 is a surface opposite to the device's surface that is coupled to the substrate 102. In some examples, the first molding material layer 110 may encapsulate a portion 116 of the bond wire 106 that is proximate (e.g., close to or directly adjacent) to the first connection location 120. In some examples, the first molding material layer 110 may encapsulate a portion 118 that is proximate (e.g., close to or directly adjacent) to the second connection location 122.

In some examples, the first molding material layer 110 includes a hard molding material. In some examples, the first molding material layer 110 is disposed on the substrate 102 and extends across the substrate 102. In some examples, the first molding material layer 110 is disposed on one or more sections of the substrate 102, but the first molding material layer 110 is not disposed over one or more other sections of the substrate 102. In some examples, the first molding material layer 110 has a hardness (e.g., durometer value) greater than a first threshold level. In some examples, the first molding material layer 110 is a layer of epoxy. The layer of epoxy may include any type of epoxy formed from epoxy resins. By using a relatively hard molding material for the first molding material layer 110, the durability (and reliability) of the semiconductor power module 100 may be improved since the semiconductor device 104 and the bond wire connections are encapsulated in a hard encapsulation.

A portion 114 of the bond wire 106 is disposed outside of the first molding material layer 110. In other words, the first molding material layer 110 excludes (e.g., does not encapsulate) the portion 114 of the bond wire 106. For example, the first molding material layer 110 has a thickness 124 (e.g., a vertical thickness aligned orthogonal to a plane aligned along the semiconductor device 104) such that the first molding material layer 110 encapsulates the top surface 109 of the semiconductor device 104, the first connection location 120, and the second connection location 122 (as well as the portion 116 of the bond wire 106 and the portion 118 of the bond wire 106), but not the portion 114 of the bond wire 106. The portion 114 of the bond wire 106 may be a section of the bond wire 106 that is disposed between the first end 101 and the second end 103. In some examples, the portion 114 of the bond wire 106 is a middle section of the bond wire 106. In some examples, the portion 114 of the bond wire 106 has a length less than 25% of the overall length of the bond wire 106. The overall length of the bond wire 106 is measured from the first end 101 to the second end 103. The bond wire 106 may have an overall height measured from the top surface 109 of the semiconductor device 104 to the highest point of the bond wire 106. In some examples, the height of the portion 114 of the bond wire 106 (e.g., the part that is disposed in the second molding material layer 112) is between 10% and 70% of the overall height. In some examples, the height of the portion 114 of the bond wire 106 is less than or equal to 25%. In some examples, the height of the portion 114 of the bond wire 106 is less than or equal to 10%. In some examples, the portion 114 of the bond wire 106 is a loop portion of the bond wire 106.

The thickness 124 may be measured from the top surface 105 of the substrate 102 to a top surface 111 of the first molding material layer 110. In some examples, initially, the first molding material is in liquid form, which is poured onto the substrate 102 such that the first molding material is filled to a level above the top surface 109 of the semiconductor device 104 and above the first connection location 120 and the second connection location 122, but below the portion 114 of the bond wire 106. Then, the first molding material is cured to produce a relatively hard encapsulation. In some examples, since the first molding material is initially in liquid form and then cured, the top surface 111 of the first molding material layer 110 is substantially planar (e.g., the thickness 124 is relatively uniform across the substrate 102). However, in some examples, the top surface 111 of the first molding material layer 110 has a portion that is non-planar with another portion. For example, the thickness 124 of the first molding material layer 110 at a first location may be greater than the thickness 124 of the first molding material layer 110 at a second location.

The second molding material layer 112 is disposed on the first molding material layer 110 within the housing frame 108. In some examples, the second molding material layer 112 extends across the first molding material layer 110. In some examples, the second molding material layer 112 extends across one or more sections of the first molding material layer 110, but may not extend across one or more other sections of the first molding material layer 110. The second molding material layer 112 has a thickness 126 such that the second molding material layer 112 encapsulates the portion 114 of the bond wire 106. The hardness (e.g., durometer value) of the second molding material layer 112 is less than the hardness of the first molding material layer 110. In some examples, the hardness of the second molding material layer 112 is less than a second threshold level. In some examples, the second threshold level is less than the first threshold level. In some examples, the first molding material layer 110 has a higher thermal conductivity than the second molding material layer 112. In some examples, the second molding material layer 112 includes a soft material. In some examples, the second molding material layer 112 includes a gel material. In some examples, the second molding material layer 112 is a layer of silicone gel.

The thickness 126 is measured from the top surface 111 of the first molding material layer 110 to a top surface 113 of the second molding material layer 112. In some examples, the thickness 124 of the first molding material layer 110 is greater than the thickness 126 of the second molding material layer 112. In some examples, the thickness 126 of the second molding material layer 112 is greater than the thickness 124 of the first molding material layer 110. In some examples, initially, the second molding material is in liquid form, which is poured onto the top surface 111 of the first molding material layer 110 such that the second molding material is filled to a level above the portion 114 of the bond wire 106, but below a top 115 of the housing frame 108. Then, the second molding material is cured to produce a relatively soft encapsulation. In some examples, since the second molding material is initially in liquid form and then cured, the top surface 113 of the second molding material layer 112 is substantially planar (e.g., the thickness 126 is relatively uniform across the substrate 102). However, in some examples, the top surface 113 of the second molding material layer 112 has a portion that is non-planar with another portion. For example, the thickness 126 of the second molding material layer 112 at a first location may be greater than the thickness 126 of the second molding material layer 112 at a second location.

In response to (e.g., under) a short circuit condition, the portion 114 of the bond wire 106 (encapsulated in the second molding material layer 112) is configured to fuse (e.g., disconnect, break apart, melt), which causes the circuit to interrupt and prevent further damage to the substrate 102 and the semiconductor device 104 (as well as other semiconductor components). For example, when the semiconductor power module 100 is operating, the semiconductor power module 100 may suffer a short circuit condition, which causes a flow of high current (e.g., discharing the DC-link capacitor) within a short time. This may result in overheating of the semiconductor device 104 and adjoining assembly materials, and potentially the cracking of the substrate 102. However, before damage (or further damage) is caused by the short circuit condition in the semiconductor power module 100, the portion 114 of the bond wire 106 (encapsulated in the second molding material layer 112) fuses, which can interrupt the circuit (e.g., the semiconductor device's connection to the substrate 102). For example, in response to electrical current flowing through the bond wire 106 exceeding a threshold amount, the bond wire 106 is configured to break part at the portion 114 of the bond wire 106 encapsulated in the second molding material layer 112, which causes an interruption in the semiconductor device's connection to the substrate 102. In some examples, the center portion of the bond wire 106 (e.g., the portion 114) becomes the hot part (e.g. the hottest part) of the bond wire 106 as it is cooled down on both sides into the materials it is attached to. Also, the first molding material layer 110 may have a higher thermal conductivity than the second molding material layer 112. Accordingly, as the bond wire 106 explodes, it can expand more easily into the second molding material layer 112, as the soft portions of the second molding material layer 112 move out of the way.

As such, the two-layer molding configuration may improve the reliability and lifetime of such power modules while maintaining the endurance of the substrate 102 under a short circuit condition. For example, the two-layer molding configuration combines the higher reliability of modules using a harder encapsulation (e.g., the first molding material layer 110) with the more safe behavior of modules under short circuit conditions using a softer encapsulation (e.g., the second molding material layer 112).

Figure 2:
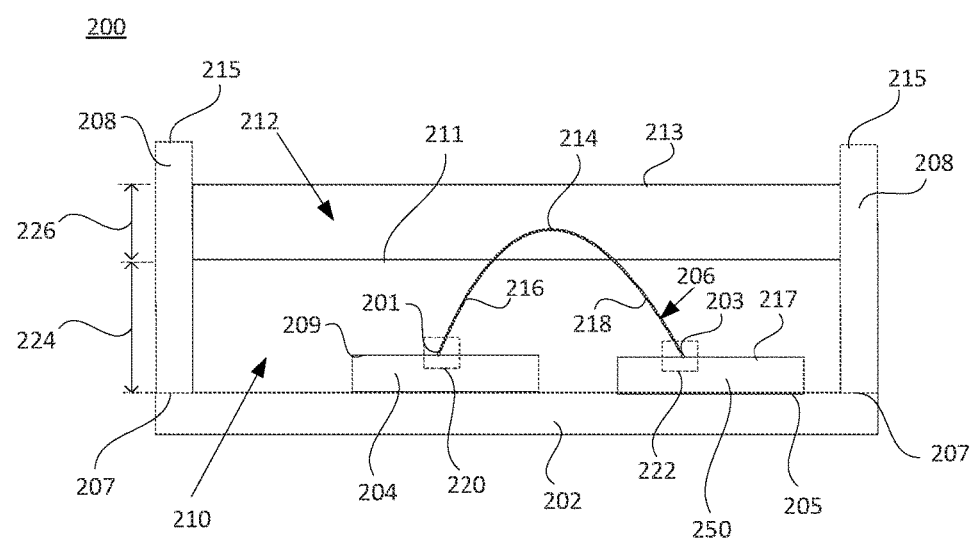
FIG. 2 illustrates a cross-sectional view of a semiconductor power module having a two-layer molding configuration according to another aspect.

FIG. 2 illustrates a cross-sectional view of a semiconductor power module 200 having a two-layer molding configuration according to another aspect. The semiconductor power module 200 includes a substrate 202, a first semiconductor device 204 coupled to the substrate 202, a second semiconductor device 250, and a bond wire 206 coupled to the first semiconductor device 204 and the second semiconductor device 250. The semiconductor power module 200 is similar to the semiconductor power module 100 of FIG. 1 except that the bond wire 206 connects two semiconductor devices (as opposed to the semiconductor power module 100 in which the bond wire 106 connects the semiconductor device 104 to the substrate 102). The semiconductor power module 200 may include one or more of the features described with reference to the semiconductor power module 100 of FIG. 1.

The first semiconductor device 204 is coupled to a top surface 205 of the substrate 202. In some examples, the first semiconductor device 204 is coupled to a first conductive portion (e.g., copper) that is coupled to an isolation substrate (e.g., ceramic substrate). In some examples, the first semiconductor device 204 is coupled to the substrate 202 using a solder material. The second semiconductor device 250 is coupled to the top surface 205 of the substrate 202. In some examples, the second semiconductor device 250 is coupled to a second conductive portion (e.g., copper) that is coupled to the isolation substrate. In some examples, the second semiconductor device 250 is coupled to the substrate 202 using a solder material. The second semiconductor device 250 is disposed on the top surface 205 of the substrate 202 at a location spaced part from the first semiconductor device 204.

In some examples, the first semiconductor device 204 and the second semiconductor device 250 are devices of the same type (e.g., both are MOSFETs). In some examples, the first semiconductor device 204 and the second semiconductor device 250 are devices of a different type. Each of the first semiconductor device 204 and the second semiconductor device 250 may include any of the features discussed with reference to the semiconductor device 104 of FIG. 1. The substrate 202 may include any of the features discussed with reference to the substrate 102 of FIG. 1.

The bond wire 206 includes a first end 201 that is coupled to the first semiconductor device 204 at a first connection location 220, and a second end 203 that is coupled to the second semiconductor device 250 at a second connection location 222. In some examples, the first end 201 is bonded to the first semiconductor device 204 at the first connection location 220, and the second end 203 is bonded to the second semiconductor device 250 at the second connection location 222. The bond wire 206 may include a metal wire (e.g., aluminum, copper, silver, gold).

The semiconductor power module 200 includes a housing frame 208 that is coupled to the substrate 202. The housing frame 208 is a casing that protects the first semiconductor device 204, the second semiconductor device 250, and other components of the semiconductor power module 200. In some examples, the housing frame 208 is coupled to an outer perimeter area 207 of the substrate 202. In some examples, the housing frame 208 includes a plastic frame.

The semiconductor power module 200 includes a two-layer molding configuration that can reduce (or eliminate) the damage caused by a short circuit condition. The two-layer molding configuration includes a first molding material layer 210 and a second molding material layer 212.

The first molding material layer 210 is disposed on the substrate 202 within the housing frame 208. In some examples, the first molding material layer 210 encapsulates the first semiconductor device 204, the second semiconductor device 250, and the bond wire connections at the first connection location 220 and the second connection location 222. For example, the first molding material layer 210 may encapsulate a top surface 209 of the first semiconductor device 204, a top surface 217 of the second semiconductor device 250, the first end 201 of the bond wire 206, and the second end 203 of the bond wire 206. The top surface 209 is a surface opposite to the one that is coupled to the substrate 202. The top surface 217 is a surface opposite to the one that is coupled to the substrate 202. In some examples, the first molding material layer 210 may encapsulate a portion 216 of the bond wire 206 that is proximate (e.g., close to, directly adjacent) to the first connection location 220. In some examples, the first molding material layer 210 may encapsulate a portion 218 that is proximate (e.g., close to, directly adjacent) to the second connection location 222.

The first molding material layer 210 may include any of the features discussed with respect to the first molding material layer 110 of FIG. 1. The first molding material layer 210 does not encapsulate a portion 214 of the bond wire 206. For example, the first molding material layer 210 has a thickness 224 such that the first molding material layer 210 encapsulates the top surface 209 of the first semiconductor device 204, the top surface 217 of the second semiconductor device 250, the first connection location 220, and the second connection location 222 (as well as the portion 216 of the bond wire 206 and the portion 218 of the bond wire 206), but not the portion 214 of the bond wire 206. The thickness 224 may be measured from the top surface 205 of the substrate 202 to a top surface 211 of the first molding material layer 210. The portion 214 of the bond wire 206 may be a section of the bond wire 206 that is disposed between the first end 201 and the second end 203. In some examples, the portion 214 of the bond wire 206 is a middle section of the bond wire 206. In some examples, the portion 214 of the bond wire 206 has a length less than 25% of the overall length of the bond wire 206. The bond wire 206 may have an overall height measured from the top surface 209 of the first semiconductor device 204 (or the top surface 217 of the second semiconductor device 250) to the highest point of the bond wire 206. In some examples, the height of the portion 214 of the bond wire 206 (e.g., the part that is disposed in the second molding material layer 212) is between 10% and 70% of the overall height. In some examples, the height of the portion 214 of the bond wire 206 is less than or equal to 25%. In some examples, the height of the portion 214 of the bond wire 206 is less than or equal to 10%. In some examples, the portion 214 of the bond wire 206 is a loop portion of the bond wire 206.

The second molding material layer 212 may include any of the features discussed with respect to the second molding material layer 112 of FIG. 1. The second molding material layer 212 is disposed on the first molding material layer 210 within the housing frame 208. The second molding material layer 212 has a thickness 226 such that the second molding material layer 212 encapsulates the portion 214 of the bond wire 206. The thickness 226 is measured from the top surface 211 of the first molding material layer 210 to a top surface 213 of the second molding material layer 212. In some examples, the thickness 224 of the first molding material layer 210 is greater than the thickness 226 of the second molding material layer 212. In some examples, the top surface 213 of the second molding material layer 212 is below a top 215 of the housing frame 208.

In response to a short circuit event, the portion 214 of the bond wire 206 (encapsulated in the second molding material layer 212) is configured to fuse (e.g., disconnect, break apart, melt), which causes the circuit to interrupt and prevent further damage to the substrate 202, the first semiconductor device 204, and the second semiconductor device 250 (as well as other semiconductor components). For example, when the semiconductor power module 200 is operating, the semiconductor power module 200 may suffer a short circuit condition, which causes a flow of high current (e.g., discharing the DC-link capacitor) within a short time. This may result in overheating of the first semiconductor device 204, the second semiconductor device 250, and adjoining assembly materials, and potentially the cracking of the substrate 202. However, before damage (or further damage) is caused by the short circuit condition in the semiconductor power module 200, the portion 214 of the bond wire 206 (encapsulated in the second molding material layer 212) fuses, which can interrupt the circuit (e.g., the connection between the first semiconductor device 204 and the second semiconductor device 250). For example, in response to electrical current flowing through the bond wire 206 exceeding a threshold amount, the bond wire 206 is configured to break part at the portion 214 of the bond wire 206 encapsulated in the second molding material layer 212, which causes an interruption in the connection between the first semiconductor device 204 and the second semiconductor device 250.

As such, the two-layer molding configuration may improve the reliability and lifetime of such power modules while maintaining the endurance of the substrate 202 under a short circuit condition. For example, the two-layer molding configuration combines a relatively hard encapsulation material (e.g., the first molding material layer 210) that has a high reliability within a module with a relatively soft encapsulation material (e.g., the second molding material layer 212) that provides for safety features within the module under short circuit conditions.

Figure 3A:
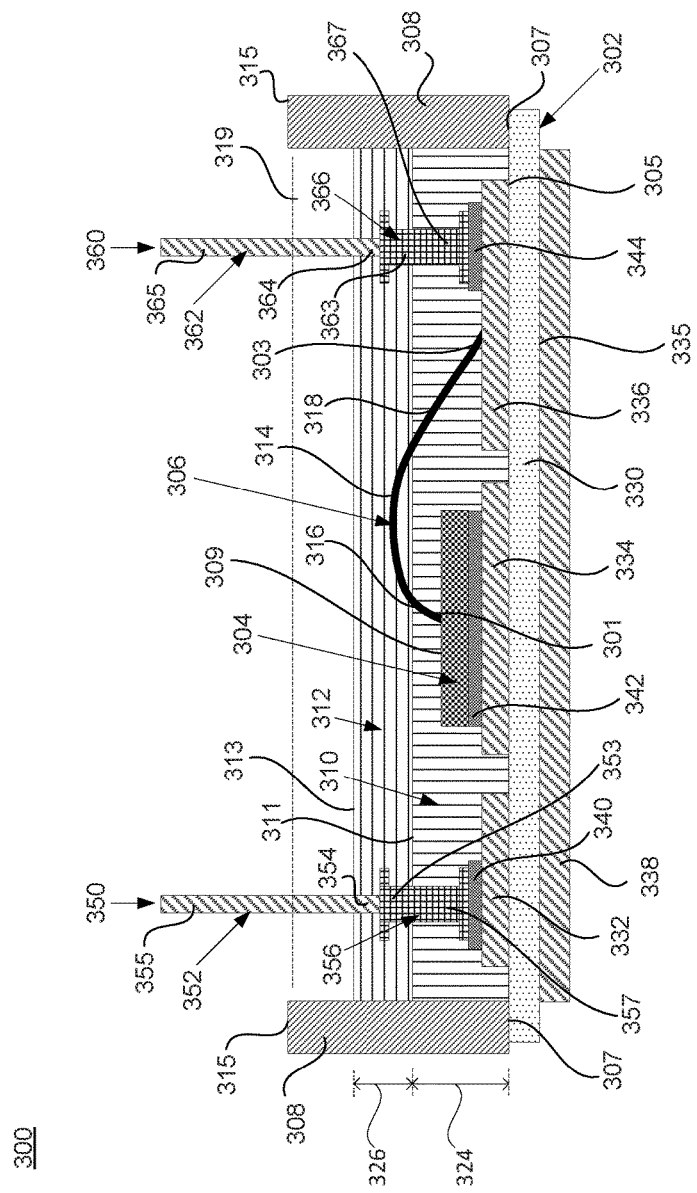
FIG. 3A illustrates a cross-sectional view of a semiconductor power module having a two-layer molding configuration according to another aspect.
Figure 3B:
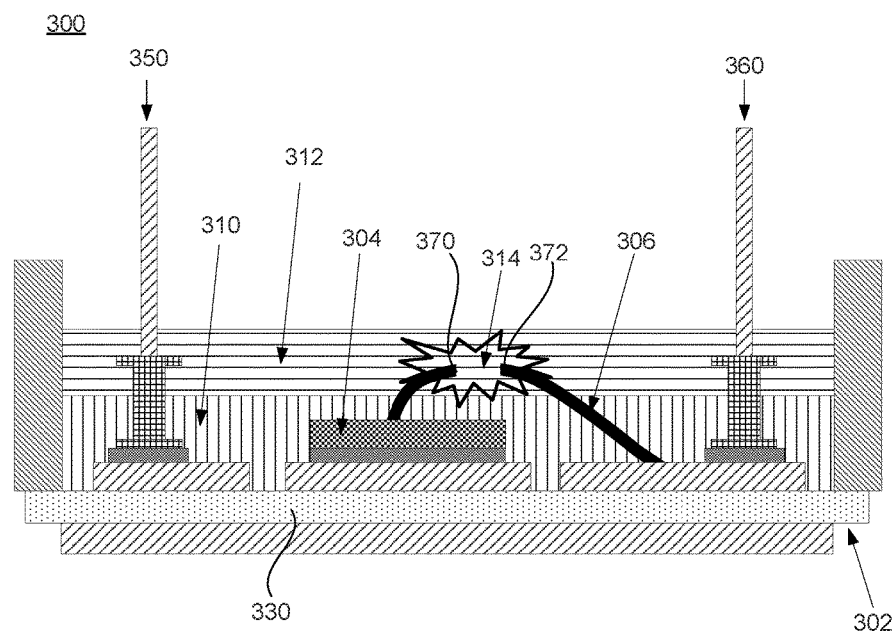
FIG. 3B illustrates a cross-section view of the semiconductor power module of FIG. 3A in response to a short circuit event according to an aspect.

FIG. 3A illustrates a cross-sectional view of a semiconductor power module 300 having a two-layer molding configuration according to another aspect. FIG. 3B illustrates a cross-section view of the semiconductor power module 300 in response to a short circuit event according to an aspect. The semiconductor power module 300 includes a substrate 302, a semiconductor device 304 coupled to the substrate 302, and a bond wire 306 coupled to the semiconductor device 304.

The substrate 302 is one or more layers of material in which one or more electrical devices are mounted. In some examples, the substrate 302 includes a direct bonded copper (DBC) substrate. In some examples, the substrate 302 includes an isolation substrate 330 having a first surface 305 and a second surface 335. The first surface 305 is disposed opposite to the second surface 335. For example, the first surface 305 is separated from the second surface 335 by a thickness of the isolation substrate 330. In some examples, the isolation substrate 330 is a ceramic substrate. The substrate 302 includes a conductive portion 332 disposed on the first surface 305 of the isolation substrate 330, a conductive portion 334 disposed on the first surface 305 of the isolation substrate 330, and a conductive portion 336 disposed on the first surface 305 of the isolation substrate 330. In some examples, each of the conductive portion 332, the conductive portion 334, and the conductive portion 336 includes a conductive material such as aluminum, copper, silver, or gold. In some examples, each of the conductive portion 332, the conductive portion 334, and the conductive portion 336 is a copper foil portion. The substrate 302 includes a conductive portion 338 disposed on the second surface 335 of the isolation substrate 330. In some examples, the conductive portion 338 includes a conductive material such as aluminum, copper, silver, or gold. In some examples, the conductive portion 338 is a copper foil portion.

The semiconductor device 304 may include one or more electrical components that use one or more semiconductor materials. In some examples, the semiconductor device 304 is a semiconductor die. In some examples, the semiconductor device 304 includes one or more integrated circuits (ICs).

In some examples, the semiconductor device 304 includes a diode. In some examples, the semiconductor device 304 includes a transistor (e.g., bipolar junction transistor, field-effect transistor, a metal-oxide-semiconductor field-effect transistor (MOSFET)).

The semiconductor device 304 is coupled to the substrate 302. In some examples, the semiconductor device 304 is coupled to the conductive portion 334 of the substrate 302. In some examples, the semiconductor device 304 is coupled to the conductive portion 334 of the substrate 302 using a solder material 342.

The bond wire 306 includes a first end 301 that is coupled to the semiconductor device 304, and a second end 303 that is coupled to the substrate 302. In some examples, the second end 303 is coupled to the conductive portion 336 of the substrate 302. In some examples, the first end 301 is bonded to the semiconductor device 304, and the second end 303 is bonded to the conductive portion 336 of the substrate 302. The bond wire 306 may include a metal wire (e.g., aluminum, copper, silver, gold).

The semiconductor power module 300 includes a housing frame 308 that is coupled to the substrate 302. A plane 319 extends across a top 315 of the housing frame 308. The housing frame 308 is a casing that protects the semiconductor device 304 and other components of the semiconductor power module 300. In some examples, the housing frame 308 is coupled to an outer perimeter area 307 of the isolation substrate 330. In some examples, the housing frame 308 includes a plastic frame.

The semiconductor power module 300 includes a first connector 350. The first connector 350 is coupled to the substrate 302. The first connector 350 is configured to connect to a device or system external to the semiconductor power module 300. In some examples, the first connector 350 includes a terminal holder 356 and a connector pin 352. In some examples, the connector pin 352 is a component separate from the terminal holder 356, and the connector pin 352 is coupled to the terminal holder 356. In some examples, one end of the connector pin 352 is coupled to the terminal holder 356 (e.g., snap-fit, solder or other adhesive), and the other end of the connector pin 352 extends outside the housing frame 308 (e.g., crosses the plane 319). In some examples, the connector pin 352 is a linear member. In some examples, the connector pin 352 is integrally formed with the terminal holder 356. For example, the connector pin 352 and the terminal holder 356 may be separate sections of a single unitary body. The terminal holder 356 is coupled to the substrate 302. In some examples, the terminal holder 356 is coupled to the conductive portion 332 of the substrate 302. In some examples, the terminal holder 356 is coupled to the conductive portion 332 of the substrate 302 using a solder material 340.

The semiconductor power module 300 includes a second connector 360. The second connector 360 is coupled to the substrate 302. The second connector 360 is configured to connect to a device or system external to the semiconductor power module 300. In some examples, the second connector 360 includes a terminal holder 366 and a connector pin 362. In some examples, the connector pin 362 is a component separate from the terminal holder 366, and the connector pin 362 is coupled to the terminal holder 366. In some examples, one end of the connector pin 362 is coupled to the terminal holder 366 (e.g., snap-fit, solder or other adhesive), and the other end of the connector pin 362 extends outside the housing frame 308 (e.g., crosses the plane 319). In some examples, the connector pin 362 is a linear member. In some examples, the connector pin 362 is integrally formed with the terminal holder 366. For example, the connector pin 362 and the terminal holder 366 may be separate sections of a single unitary body. The terminal holder 366 is coupled to the substrate 302. In some examples, the terminal holder 366 is coupled to the conductive portion 336 of the substrate 302 (e.g., the same conductive portion in which the second end 303 of the bond wire 306 is coupled to). In some examples, the terminal holder 366 is coupled to the conductive portion 336 of the substrate 302 using a solder material 344.

The semiconductor power module 300 includes a two-layer molding system that can reduce (or eliminate) the damage caused by a short circuit condition. The two-layer molding configuration includes a first molding material layer 310 and a second molding material layer 312.

The first molding material layer 310 is disposed on the substrate 302 within the housing frame 308. The first molding material layer 310 may have a thickness 324. The thickness 324 may be measured from the first surface 305 of the isolation substrate 330 to a top surface 311 of the first molding material layer 310. In some examples, the first molding material layer 310 encapsulates the semiconductor device 304 and the bond wire connections to the semiconductor device 304 and the substrate 302. For example, the first molding material layer 310 may encapsulate the conductive portion 334, the solder material 342, a top surface 309 of the semiconductor device 304, the first end 301 of the bond wire 306, the conductive portion 336, and the second end 303 of the bond wire 306. In some examples, the first molding material layer 310 may encapsulate a portion 316 of the bond wire 306 that is proximate to first end 301, and a portion 318 of the bond wire 306 that is proximate to the second end 303. In some examples, the first molding material layer 310 may encapsulate the conductive portion 332, the solder material 340, and a portion 357 of the terminal holder 356 of the first connector 350. In some examples, the first molding material layer 310 may encapsulate the conductive portion 336, the solder material 344, and a portion 367 of the terminal holder 366 of the second connector 360.

In some examples, the first molding material layer 310 includes a hard molding material. In some examples, the first molding material layer 310 has a hardness (e.g., durometer value) greater than a first threshold level. In some examples, the first molding material layer 310 is a layer of epoxy. The layer of epoxy may include any type of epoxy formed from epoxy resins. By using a relatively hard molding material for the first molding material layer 310, the durability (and reliability) of the semiconductor power module 300 may be improved since the semiconductor device 304, the bond wire connections, and portions of the other components and their connections to the substrate 302 are encapsulated in a hard encapsulation.

The first molding material layer 310 does not encapsulate a portion 314 of the bond wire 306. The portion 314 of the bond wire 306 may be a section of the bond wire 306 that is disposed between the first end 301 and the second end 303. In some examples, the portion 314 of the bond wire 306 is a middle section of the bond wire 306. In some examples, the portion 314 of the bond wire 306 has a length less than 25% of the overall length of the bond wire 306. The overall length of the bond wire 306 is measured from the first end 301 to the second end 303. In some examples, the portion 314 of the bond wire 306 is a loop portion of the bond wire 306. The bond wire 306 may have an overall height measured from the top surface 309 of the semiconductor device 304 to the highest point of the bond wire 306. In some examples, the height of the portion 314 of the bond wire 306 (e.g., the part that is disposed in the second molding material layer 312) is between 10% and 70% of the overall height. In some examples, the height of the portion 314 of the bond wire 306 is less than or equal to 25%. In some examples, the height of the portion 314 of the bond wire 306 is less than or equal to 10%.

In some examples, the first molding material layer 310 does not encapsulate a portion 353 of the terminal holder 356 of the first connector 350, and the connector pin 352. In some examples, no portion of the connector pin 352 is encapsulated in the first molding material layer 310. In some examples, the first molding material layer 310 does not encapsulate a portion 363 of the terminal holder 366 of the second connector 360, and the connector pin 362. In some examples, no portion of the connector pin 362 is encapsulated in the first molding material layer 310.

The second molding material layer 312 is disposed on the first molding material layer 310 within the housing frame 308. The second molding material 312 has a thickness 326. The thickness 326 is measured from the top surface 311 of the first molding material layer 310 to a top surface 313 of the second molding material layer 312. In some examples, the thickness 324 of the first molding material layer 310 is greater than the thickness 326 of the second molding material layer 312.

The second molding material layer 312 encapsulates the portion 314 of the bond wire 306. In some examples, the second molding material layer 312 encapsulates the portion 353 of the terminal holder 356 of the first connector 350 and a portion 354 of the connector pin 352. In some examples, a portion 355 of the connector pin 352 is not encapsulated by the second molding material layer 312. In some examples, the second molding material layer 312 encapsulates the portion 363 of the terminal holder 366 of the second connector 360, and a portion 364 of the connector pin 362. In some example, a portion 365 of the connector pin 362 is not encapsulated by the second molding material layer 312.

The hardness (e.g., durometer value) of the second molding material layer 312 is less than the hardness of the first molding material layer 310. In some examples, the hardness of the second molding material layer 312 is less than a second threshold level. In some examples, the second threshold level is less than the first threshold level. In some examples, the first molding material layer 310 has a higher thermal conductivity than the second molding material layer 312. In some examples, the second molding material layer 312 includes a soft material. In some examples, the second molding material layer 312 includes a gel material. In some examples, the second molding material layer 312 is a layer of silicone gel.

Referring to FIG. 3B, in response to a short circuit event, the portion 314 of the bond wire 306 (encapsulated in the second molding material layer 312) is configured to fuse (e.g., disconnect, break apart, melt), which causes the circuit to interrupt and prevent further damage to the substrate 302 and the semiconductor device 304 (as well as other semiconductor components). For example, in response to the short circuit event, a portion 370 of the bond wire 306 is disconnected from a portion 372 of the bond wire 306.

In further detail, when the semiconductor power module 300 is operating, the semiconductor power module 300 may suffer a short circuit event, which causes a flow of high current (e.g., discharging the DC-link capacitor) within a short time. This may result in overheating of the semiconductor device 304 and adjoining assembly materials, and potentially the cracking of the isolation substrate 330. However, before damage (or further damage) is caused by the short circuit event in the semiconductor power module 300, the portion 314 of the bond wire 306 (encapsulated in the second molding material layer 312) fuses, which can interrupt the circuit (e.g., the semiconductor device's connection to the substrate 302). For example, in response to electrical current flowing through the bond wire 306 exceeding a threshold amount, the bond wire 306 is configured to break part at the portion 314 of the bond wire 306 encapsulated in the second molding material layer 312, which causes an interruption in the semiconductor device's connection to the substrate 302.

Figure 4:
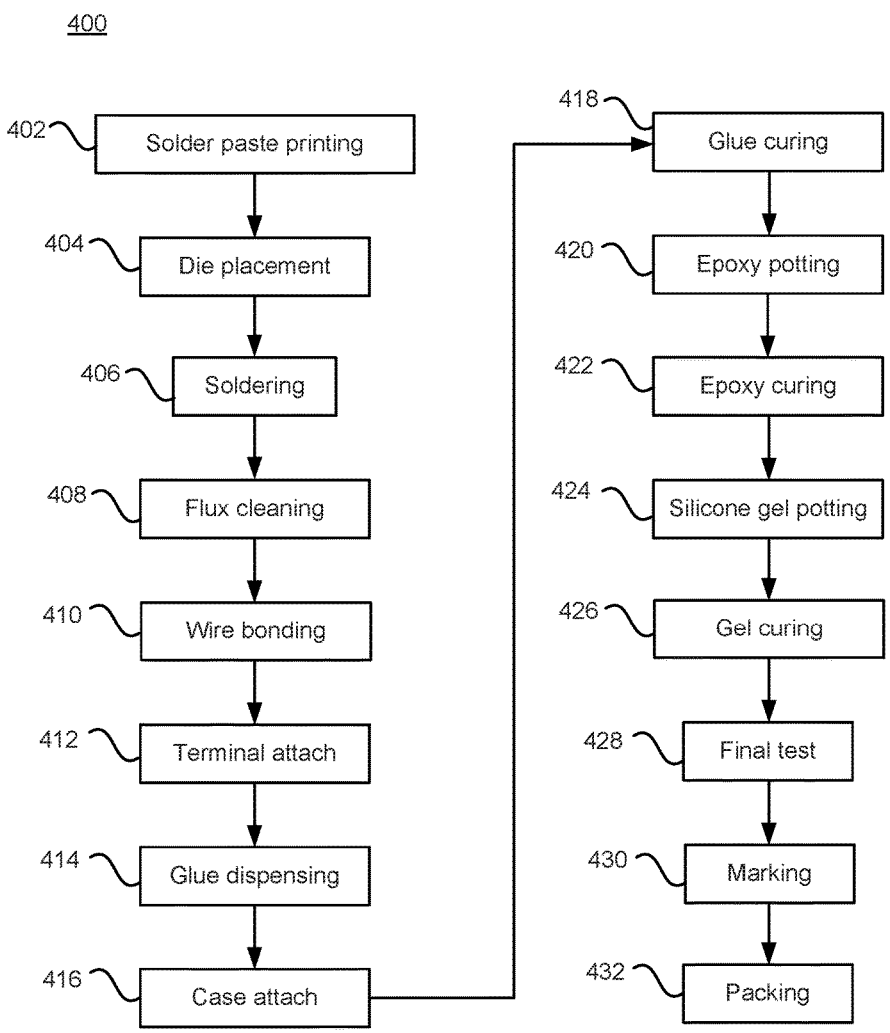
FIG. 4 illustrates a method depicting example operations for manufacturing a semiconductor power module having a two-layer molding configuration according to an aspect.

FIG. 4 illustrates a method 400 depicting example operations for manufacturing a semiconductor power module having the two-layer molding configuration according to an aspect. The semiconductor power module may be any of the semiconductor power modules (e.g., 100, 200, 300) described with reference to the previous figures.

The method 400 includes solder paste printing (operation 402), die placement (operation 404), soldering (operation 406), flux cleaning (operation 408), wire bonding (operation 410), terminal attach (operation 412), glue dispensing (operation 414), case attach (operation 416), and glue curing (operation 418).

The method 400 includes epoxy potting (operation 420). For example, operation 420 may include disposing epoxy in a housing frame of a semiconductor power module having a substrate, a semiconductor device coupled to the substrate, and a bond wire coupled to the semiconductor device.

The method 400 includes epoxy curing (operation 422). For example, operation 422 may include curing the epoxy, where the epoxy forms a layer having a thickness such that the layer of epoxy encapsulates the semiconductor device and a first portion of the bond wire. The bond wire has a second portion that is not encapsulated by the layer of epoxy (e.g., the second portion is exposed above the layer of epoxy). The method 400 includes silicone gel potting (operation 424). For example, operation 424 may include disposing silicone gel on top of the layer of epoxy. The method 400 includes gel curing (operation 426). For example, operation 426 may include curing the silicone gel, where the second portion of the bond wire is encapsulated by the silicone gel. The method 400 includes final test (operation 428), marking (operation 430), and packing (operation 432).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A semiconductor power module including:
   a substrate;
   a semiconductor device coupled to the substrate;
   a bond wire coupled to the semiconductor device;
   a first molding material layer disposed on the substrate, the first molding material layer encapsulating a first portion of the bond wire, the bond wire having a second portion disposed outside of the first molding material layer; and
   a second molding material layer disposed on the first molding material layer, the second molding material layer encapsulating the second portion of the bond wire, the second molding material layer having a hardness less than a hardness of the first molding material layer,
   the second portion of the bond wire configured to fuse in response to a short circuit condition.

2. The semiconductor power module of claim 1, wherein the substrate includes a ceramic substrate with a conductive portion coupled to a surface of the ceramic substrate.

3. The semiconductor power module of claim 1, wherein the first molding material layer is a layer of epoxy.

4. The semiconductor power module of claim 1, wherein the first portion of the bond wire is an end of the bond wire, the end of the bond wire being coupled to the semiconductor device at a connection location, the first molding material layer encapsulating the connection location.

5. The semiconductor power module of claim 1, wherein the first portion of the bond wire is a first end of the bond wire, the first end being coupled to the semiconductor device at a first connection location, wherein a second end of the bond wire is coupled to the substrate at a second connection location, the first molding material layer encapsulating the first connection location and the second connection location.

6. The semiconductor power module of claim 1, wherein the semiconductor device is a first semiconductor device, wherein the semiconductor power module further comprising:
   a second semiconductor device coupled to the substrate, the first portion of the bond wire being a first end of the bond wire, the first end being coupled to the first semiconductor device at a first connection location, the bond wire having a second end coupled to the second semiconductor device at a second connection location, the first molding material layer encapsulating the first connection location and the second connection location.

7. The semiconductor power module of claim 1, wherein the second portion of the bond wire is a portion disposed between a first end of the bond wire and a second end of the bond wire.

8. The semiconductor power module of claim 1, further comprising:
   a connector coupled to the substrate, the connector having a first portion encapsulated in the first molding material layer, and a second portion encapsulated in the second molding material layer.

9. The semiconductor power module of claim 1, wherein the second molding material layer is a layer of silicone gel.

10. A semiconductor power module including:
    a substrate;
    a semiconductor device coupled to the substrate using a solder material;
    a bond wire having a first end and a second end, the first end being connected to the semiconductor device at a first connection location, the second end being connected to a portion of the substrate at second connection location;
    a housing frame coupled to the substrate;
    a first molding material layer disposed on the substrate within the housing frame, the first molding material layer having a thickness such that the first molding material layer encapsulates the semiconductor device, the solder material, the first connection location, and the second connection location, the first molding material layer not encapsulating a portion of the bond wire between the first end and the second end; and
    a second molding material layer disposed on the first molding material layer within the housing frame, the second molding material layer encapsulating the portion of the bond wire between the first end and the second end, the second molding material layer having a hardness less than a hardness of the first molding material layer.

11. The semiconductor power module of claim 10, wherein the substrate includes a direct bonded copper (DBC) substrate.

12. The semiconductor power module of claim 10, further comprising:
    a first terminal holder coupled to the substrate, the first terminal holder having a first portion encapsulated in the first molding material layer and a second portion encapsulated in the second molding material layer;
    a first connector pin coupled to the first terminal holder;
    a second terminal holder coupled to the substrate, the second terminal holder having a first portion encapsulated in the first molding material layer and a second portion encapsulated in the second molding material layer; and
    a second connector pin coupled to the second terminal holder.

13. The semiconductor power module of claim 12, wherein a portion of the first connector pin is encapsulated in the second molding material layer, and no portion of the first connector pin is encapsulated in the first molding material layer.

14. The semiconductor power module of claim 10, wherein the first molding material layer is a layer of epoxy, and the second molding material layer is a layer of silicone gel.

15. The semiconductor power module of claim 10, wherein the housing frame is a plastic frame.

16. The semiconductor power module of claim 10, wherein the substrate includes a ceramic substrate with a first conductive portion coupled to a first surface of the ceramic substrate, the semiconductor device being coupled to the first conductive portion, the substrate including a second conductive portion coupled to a second surface of the ceramic substrate, the second surface being opposite to the first surface.

17. The semiconductor power module of claim 10, wherein, in response to electrical current flowing through the bond wire exceeding a threshold amount, the bond wire is configured to fuse at the portion of the bond wire encapsulated in the second bonding material layer causing an interruption in the connection of the semiconductor device to the substrate.

18. A method of manufacturing a semiconductor power module, the method comprising:
   disposing epoxy in a housing frame of a semiconductor power module having a substrate, a semiconductor device coupled to the substrate, and a bond wire coupled to the semiconductor device;
   curing the epoxy, the epoxy forming a layer having a thickness such that the layer of epoxy encapsulates the semiconductor device and a first portion of the bond wire, the bond wire having a second portion that is exposed above the layer of epoxy;
   disposing silicone gel on top of the layer of epoxy; and
   curing the silicone gel, the second portion of the bond wire being encapsulated by the silicone gel.

19. A semiconductor power module comprising:
   a substrate;
   a first semiconductor device coupled to the substrate;
   a second semiconductor device coupled to the substrate;
   a bond wire having a first end coupled to the first semiconductor device at a first connection location and a second end coupled to the second semiconductor device at a second connection location;
   a first molding material layer disposed on the substrate, the first molding material layer encapsulating the first end of the bond wire, the first molding material layer encapsulating the first connection location and the second connection location, the bond wire having a portion disposed outside of the first molding material layer; and
   a second molding material layer disposed on the first molding material layer, the second molding material layer encapsulating the portion of the bond wire, the second molding material layer having a hardness less than a hardness of the first molding material layer.

20. The semiconductor power module of claim 19, wherein the first molding material layer has a vertical thickness greater than a vertical thickness of the second molding material layer.

\* \* \* \* \*